(12) United States Patent  (10) Patent No.: US 8,525,771 B2
Kawana et al.  (45) Date of Patent: Sep. 3, 2013

(54) IMAGE DISPLAY APPARATUS AND METHOD OF ADJUSTING CLOCK PHASE USING DELAY EVALUATION SIGNAL

(75) Inventors: Toshiyuki Kawana, Tokyo (JP); Michiya Nishida, Tokyo (JP)

(73) Assignee: Nec Display Solutions, Ltd., Tokyo (JP)

( * ) Notice: Subject to any disclaimer, the term of this patent is extended or adjusted under 35 U.S.C. 154(b) by 114 days.

(21) Appl. No.: 12/662,360

(22) Filed: Apr. 13, 2010

(65) Prior Publication Data

US 2010/0201874 A1 Aug. 12, 2010

Related U.S. Application Data

(62) Division of application No. 11/798,579, filed on May 15, 2007.

(30) Foreign Application Priority Data

Jun. 30, 2006 (JP) .................................. 2006-181437

(51) Int. Cl.
*G09G 3/36* (2006.01)

(52) U.S. Cl.
USPC .......................................................... 345/99

(58) Field of Classification Search
USPC .......................................................... 345/99
See application file for complete search history.

(56) References Cited

U.S. PATENT DOCUMENTS

| | | | |
|---|---|---|---|
| 5,767,916 A | 6/1998 | West | |
| 5,940,136 A * | 8/1999 | Abe et al. | 348/500 |
| 6,097,444 A | 8/2000 | Nakano | |
| 6,147,668 A | 11/2000 | Eglit | |
| 6,160,542 A | 12/2000 | Hwang | |
| 6,201,535 B1 | 3/2001 | Hwang | |
| 6,304,296 B1 | 10/2001 | Yoneno | |
| 6,337,682 B1 | 1/2002 | Hwang | |
| 6,628,276 B1 | 9/2003 | Elliott | |

(Continued)

FOREIGN PATENT DOCUMENTS

| CN | 1713267 A | 12/2005 |
|---|---|---|
| EP | 1 677 095 A | 8/2004 |

(Continued)

OTHER PUBLICATIONS

Office Action in U.S. Appl. No. 11/798,579 dated May 6, 2010.

(Continued)

*Primary Examiner* — Adam J Snyder
(74) *Attorney, Agent, or Firm* — McGinn Intellectual Property Law Group, PLLC

(57) ABSTRACT

An image display apparatus includes a controller for dividing at least a portion of an image displayed based on a digital video signal, into a plurality of image areas defined by display lines, and establishing different delays for the divided image areas, a clock adjuster generating a clock in synchronism with the dot clock, delaying a phase of the clock according to the delays established by the controller, for the respective divided image areas, and outputting the delayed clock as the reproduced dot clock, and a delay evaluating unit converting differential data between adjacent signal levels into absolute values and accumulatively adding the absolute values based on the reproduced dot clock output from the clock adjuster, with respect to the display lines which define the divided image areas, thereby producing accumulated sums. The controller judges the delay established for the divided area with the maximum accumulated sum, as optimum.

12 Claims, 6 Drawing Sheets

(56) References Cited

U.S. PATENT DOCUMENTS

| | | |
|---|---|---|
| 6,686,969 B1 | 2/2004 | Hara et al. |
| 6,700,570 B2 | 3/2004 | Tachibana et al. |
| 6,731,343 B2 | 5/2004 | Yoneno |
| 7,061,281 B2 | 6/2006 | Shih et al. |
| 7,298,916 B2 | 11/2007 | Miyamoto |
| 2002/0018125 A1 | 2/2002 | Tachibana et al. |
| 2004/0012580 A1* | 1/2004 | Yamagishi et al. .......... 345/204 |
| 2005/0275436 A1 | 12/2005 | Shih et al. |
| 2006/0220992 A1 | 10/2006 | Tanaka et al. |

FOREIGN PATENT DOCUMENTS

| | | |
|---|---|---|
| JP | 10-26953 | 1/1998 |
| JP | 10-63234 | 3/1998 |
| JP | 2000-020009 | 1/2000 |
| JP | 2000-89709 | 3/2000 |
| JP | 2000-156795 | 6/2000 |
| JP | 2000-267619 * | 9/2000 |
| JP | 2000-352965 | 12/2000 |
| JP | 2001-166728 | 6/2001 |
| JP | 2001-356729 | 12/2001 |
| JP | 2003-204529 | 7/2003 |
| JP | 3487119 | 10/2003 |
| JP | 2004-236004 | 8/2004 |
| JP | 2004258130 A * | 9/2004 |
| JP | 2005-284072 | 10/2005 |
| KR | 20060030916 A | 4/2006 |
| WO | WO 2005/015528 A1 | 2/2005 |

OTHER PUBLICATIONS

European Search Report dated Aug. 6, 2008.
Japanese Office Action dated May 7, 2008, with partial English translation.

* cited by examiner

IMAGE DISPLAY APPARATUS AND METHOD OF ADJUSTING CLOCK PHASE USING DELAY EVALUATION SIGNAL

The present Application is a Divisional Application of U.S. patent application Ser. No. 11/798,579, filed on May 15, 2007, which is based on and claims priority from Japanese Patent Application No. 2006-181437, filed on Jun. 30, 2006, the entire contents of which are incorporated herein by reference.

BACKGROUND OF THE INVENTION

1. Field of the Invention

The present invention relates to an image display apparatus employing a grid-like matrix of display elements, such as a liquid crystal panel display, a plasma display, an EL display, or the like, and more particularly to an image display apparatus to be connected to a video signal source for outputting a video signal such as an RGB video signal and a high-definition video signal.

2. Description of the Related Art

There are known image display apparatus employing a grid-like matrix of display elements, such as a liquid crystal panel display or the like.

The image display apparatus of the above type is connected to a video signal source such as a personal computer, a workstation, or the like, and is capable of displaying an image based on a video signal supplied from the video signal source.

The video signal source supplies the image display apparatus with a video signal whose signal level changes at a constant frequency (hereinafter referred to as "dot clock") that is higher than the frequency of a horizontal synchronizing signal representing the display period in a horizontal direction of a displayed image. The image display apparatus reproduces a dot clock having the same frequency as the dot clock in the video signal source, and displays an image based on the video signal from the video signal source based on the reproduced dot clock. The dot clock reproduced in the image display apparatus will be referred to as "reproduced dot clock". The image display apparatus has a PLL (Phase Locked Loop) circuit, and can adjust the frequency of the reproduced dot clock so as to be an integral multiple of the frequency of the horizontal synchronizing signal for the video signal supplied from the video signal source, by changing the frequency-division ratio of the frequency divider of the PLL circuit.

If the dot clock frequency (or the frequency-division ratio) in the video signal source is known, the frequency of the reproduced dot clock can accurately be equalized to the dot clock frequency in the video signal source by setting the frequency-division ratio of the PLL circuit according to the known dot clock frequency.

If the input video signal is an analog signal, however, no information is available as to the dot clock supplied from the video signal source to the image display apparatus, and only a horizontal synchronizing signal and a vertical synchronizing signal are provided as timing information. Since the image display apparatus cannot acquire, in advance, the dot clock frequency (or the frequency-division ratio) in the video signal source, there is no guarantee that the frequency-division ratio of the frequency divider of the PLL circuit will be set to a correct value. If the frequency-division ratio is not set to a correct value, then since the frequency of the reproduced dot clock is not in agreement with the frequency of the dot clock in the video signal source, a deviation occurs between the reproduced dot clock for capturing the video signal and the video signal, with the result that the image cannot properly be displayed.

The user itself may be able to adjust the frequency of the reproduced dot clock while watching the displayed image, using an adjustment function of the image display apparatus. However, it is highly tedious and time-consuming for the user to manually adjust the frequency of the reproduced dot clock.

There has been proposed an apparatus for automatically adjusting the frequency of the reproduced dot clock.

Japanese patent No. 3487119 (hereinafter referred to as "Patent Document 1") discloses a dot clock reproducing apparatus having an A/D converter for converting an input video signal (analog) supplied from a video signal source into a digital signal, a PLL circuit for generating a clock in synchronism with the horizontal synchronizing signal of the input video signal, a frequency analyzing means for detecting an aliasing frequency which is produced when the input video signal is converted into a digital signal with a sampling clock that is different from the dot clock of the input video signal, and a frequency-division ratio setting circuit for setting a frequency-division ratio of the PLL circuit depending on the aliasing frequency detected by the frequency analyzing means. The disclosed dot clock reproducing apparatus automatically adjusts the frequency of the reproduced dot clock so as to minimize the aliasing frequency, without the need for manual frequency adjustment.

A process of automatically adjusting the frequency of the reproduced dot clock is also disclosed in U.S. Pat. No. 5,767, 916 (hereinafter referred to as "Patent Document 2") in addition to Patent Document 1.

According to Patent Document 2, the frequency of a horizontal synchronizing signal that is supplied simultaneously with an analog video signal (RGB) is measured, and the number of lines during one frame is counted. From the frequency of the horizontal synchronizing signal and the number of lines during one frame, a table is referred to for estimating the horizontal resolution of the analog video signal and the frequency of the dot clock, and a horizontal display interval E of the analog video signal and a frequency-division ratio n are temporarily established. Then, a horizontal display interval W of the actually captured video signal is determined. If W<E or W>E, a new frequency-division ratio n' is determined according to the equation n'=n×E/W and then the same measurement is carried out with respect to the following frame. If W=E, then it is judged that the frequency of the reproduced dot clock is accurately adjusted, and the automatic adjusting process is put to an end.

However, even when the frequency of the reproduced dot clock is accurately adjusted, if the phase of the video signal and the reproduced dot clock is not properly adjusted, then the display image suffers fluctuation and flickering. This problem will specifically be described below.

A reproduced dot clock generated by a PLL circuit suffers fluctuation (jitter) on the time axis. Jitter is determined by a time constant circuit such as a loop filter or the like of the PLL circuit. Since a tradeoff generally exists between jitter and response speed, it is difficult to eliminate jitter. Since the reproduced dot clock suffers jitter of necessity, even when the frequency of the reproduced dot clock is in agreement with the frequency of the dot clock in the video signal source, if the phase of the reproduced dot clock is not correct, then it is difficult to display the image stably. The reasons for this problem will specifically be described below.

FIG. 1 of the accompanying drawings shows the manner in which the phase relationship between an input video signal and a reproduced dot clock is correctly adjusted, and FIG. 2 of the accompanying drawings shows the manner in which an input video signal and a reproduced dot clock are out of phase with each other. The video signal shown in FIGS. 1 and 2 represents a portion of one line displayed on the screen, and has its signal level varying according to the dot clock in the video signal source. In the example shown in FIGS. 1 and 2, the video signal includes a succession of signals having different signal levels, e.g., nth signal 32, (n+1)th signal 34, (n+2)th signal 35. Changing points 33 whose levels change gradually are present between signals 32, 34, 35.

The phase of reproduced dot clock is in agreement with negative-going edges, for example, of the horizontal synchronizing signal of the input video signal. The frequency of the reproduced dot clock is represented by an integral multiple of the horizontal synchronizing signal (the frequency-division ratio). No phase comparison is possible from a negative-going edge to a next negative-going edge of the horizontal synchronizing signal. Therefore, fluctuation on the time axis, called jitter, occurs on positive-going edges of the reproduced dot clock. A positive-going edge of the reproduced dot clock is present somewhere in jitter area 31, but its position cannot be located because it varies from line to line and from frame to frame.

In FIG. 1, since jitter area 31 of the reproduced dot clock is positioned in a stable level portion of the video signal, the video signal can be sampled correctly regardless of the position of the positive-going edge in jitter area 31. In FIG. 2, however, since jitter area 31 of the reproduced dot clock is positioned at a changing point of the video signal, nth signal 32 is sampled on a certain line, and (n+1)th signal 34 is sampled or changing point 33 is sampled on another line. As a result, the sampled image becomes indefinite. If the video signal and the reproduced dot clock are out of phase with each other, then the example shown in FIG. 2 occurs, and the sampled image becomes indefinite, resulting in a reduction in the displayed image quality. Particularly, flickering occurs at image edges due to the phase shift.

To solve the above problem, Patent Document 1 discloses a dot clock reproducing apparatus for determining the difference between the sampled values of adjust dots in a converted digital video signal, accumulatively adding the absolute values of the differences during one frame, and adjusting the phase of an output clock from a PLL circuit based on the accumulated sum of the absolute values of the differences during one frame. The disclosed dot clock reproducing apparatus determines a phase adjustment value at the time the accumulated sum of the absolute values of the differences is minimum, and automatically adjusts the phase of the reproduced dot clock so as to estimate a phase adjustment value that is ½ period shifted from the determined phase adjustment value, as an optimum value.

However, the disclosed dot clock reproducing apparatus disclosed in Patent Document 1 evaluates phase adjustment for each frame, and hence requires time-consuming processing because it needs to evaluate phase adjustment for several frames to several tens of frames in order to determine an optimum value for phase adjustment.

Generally, when a digital video signal is received from a video signal source, not only digital video signals of R, G, B and horizontal and vertical synchronizing signals, but also a dot clock, are supplied from the video source. Therefore, it is guaranteed that the frequency of the dot clock is optimum. However, if a very long cable which is not up to given standards is used to interconnect the video signal source and the image display apparatus or if the layout of components in the image display apparatus, i.e., the pattern of signal lines for transmitting a video signal and a dot clock, is not appropriate, then the dot clock and the digital video signal may possibly be out of phase with each other. Inasmuch as there is no guarantee that the digital video signal and the dot clock are in phase with each other, the displayed image quality may be degraded due to a phase shift between the digital video signal and the dot clock as is the case with the analog video signal.

SUMMARY OF THE INVENTION

It is an object of the present invention to provide an image display apparatus which will solve the above problems and is capable of automatically adjusting the phase of a reproduced dot clock quickly.

To achieve the above object, there is provided in accordance with a first aspect of the present invention an image display apparatus comprising: an A/D converter to which an analog video signal whose signal level changes at a constant dot clock that is higher than a frequency of a synchronizing signal representing a display period in a given direction of a displayed image is supplied, the A/D converter sampling the analog video signal based on a supplied reproduced dot clock and converting the sampled analog video signal into a digital video signal; a controller that divides at least a portion of an image displayed based on the digital video signal output from the A/D converter, into a plurality of image areas defined by display lines in the given direction, and establishes different delays for the divided image areas; a clock adjusting circuit that generates a clock in synchronism with the synchronizing signal, delays a phase of the clock according to the delays established by the controller, for the respective divided image areas, and outputs the delayed clock as the reproduced dot clock; and a delay evaluating circuit that converts differential data between adjacent signal levels into absolute values and accumulatively adds the absolute values in the given direction based on the reproduced dot clock output from the clock adjusting circuit, with respect to the display lines which define the divided image areas, thereby producing accumulated sums; wherein the controller judges the delay established for the divided area with the maximum accumulated sum, as an optimum delay.

If the video signal and the reproduced dot clock are brought out of phase with each other and the quality of a displayed image is degraded due to jitter, then the accumulated sums of the absolute values of the differential data become smaller. If the video signal and the reproduced dot clock are in substantial phase with each other, then the accumulated sums of the absolute values of the differential data become greater. When a delay for maximizing the accumulated sum of the absolute values of the differential data is given, the phase of the reproduced dot clock is adjusted correctly. The image display apparatus according to the first aspect of the invention prevents the image quality from being degraded due to a phase shift between the video signal and the reproduced dot clock by judging the delay for maximizing the accumulated sum of the absolute values of the differential data, as an optimum delay.

Furthermore, in the image display apparatus according to the first aspect of the invention, at least a portion of one frame (or one field) of image is divided into a plurality of image areas, and the phase of the reproduced dot clock is evaluated with different delays in the respective divided image areas. Since the phase of the reproduced dot clock is evaluated with respect to a plurality of delays in one frame (or one field) of displayed image, an optimum value for phase adjustment can be determined in one frame (or one field) of image.

According to a second aspect of the present invention, there is also provided an image display apparatus for being supplied with a digital video signal whose signal level changes at a constant dot clock that is higher than a frequency of a synchronizing signal representing a display period in a given direction of a displayed image, and displaying an image based on the digital video signal, the image display apparatus comprising: a controller that divides at least a portion of an image displayed based on the digital video signal, into a plurality of image areas defined by display lines in the given direction, and establishes different delays for the divided image areas; a clock adjusting circuit that generates a clock in synchronism with the dot clock, delays a phase of the clock according to the delays established by the controller, for the respective divided image areas, and outputs the delayed clock as the reproduced dot clock; and a delay evaluating circuit that converts differential data between adjacent signal levels into absolute values and accumulatively adds the absolute values in the given direction based on the reproduced dot clock output from the clock adjusting circuit, with respect to the display lines which define the divided image areas, thereby producing accumulated sums; wherein the controller judges the delay established for the divided area with the maximum accumulated sum, as an optimum delay.

The image display apparatus according to the second aspect operates in the same manner as the image display apparatus according to the first aspect to determine an optimum value for phase adjustment of the reproduced dot block with respect to the digital video signal, in one frame (or one field) of image.

According to the present invention, as described above, since an optimum delay can be determined only by evaluating one frame of image, the phase of the reproduced dot block can be adjusted extremely quickly.

The above and other objects, features, and advantages of the present invention will become apparent from the following description with reference to the accompanying drawings which illustrate examples of the present invention.

DETAILED DESCRIPTION OF THE PREFERRED EMBODIMENTS

Figure 3:
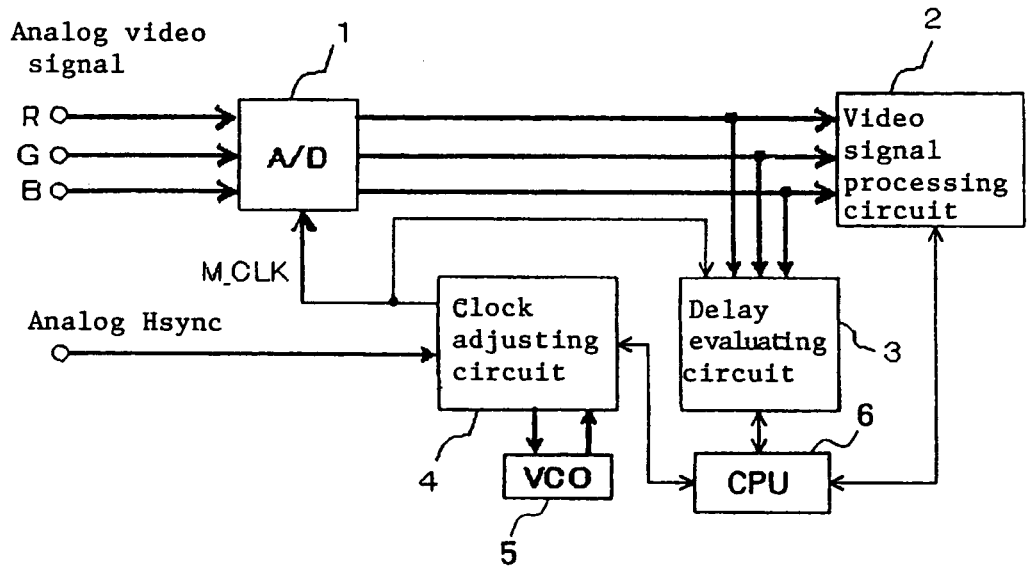
FIG. 3 is a block diagram showing a general arrangement of an image display apparatus according to an embodiment of the present invention.

FIG. 3 shows in block form a general arrangement of an image display apparatus according to an embodiment of the present invention. The image display apparatus has a display device, not shown, employing a grid-like matrix of display elements, such as a liquid crystal panel display, a plasma display, an EL display, or the like. The image display apparatus also has circuits for displaying an image on the display device based on an analog video signal supplied from an external source. The circuits include A/D converter 1, video signal processing circuit 2, delay evaluating circuit 3, clock adjusting circuit 4, VCO (Voltage-Controlled Oscillator) 5, and CPU (Central Processing Unit) 7. Though not shown in FIG. 3, the image display apparatus also has a function to adjust the frequency of a reproduced dot clock. The frequency adjusting function is an existing frequency adjusting function such as the frequency adjusting function disclosed in Patent Document 2 referred to above.

A/D converter 1 is supplied with input analog video signals (R, G, B) supplied from a video signal source such as a personal computer, a workstation, or the like, and samples and converts the supplied input analog video signals (R, G, B) into digital signals based on a reproduced dot clock supplied from clock adjusting circuit 4. The input analog video signals (R, G, B) are signals whose signal levels change at a constant frequency that is higher than the frequency of a horizontal synchronizing signal representing the display period in a horizontal direction of a displayed image. The digital video signals (R, G, B) output from A/D converter 1 are supplied to video signal processing circuit 2 and delay evaluating circuit 3.

Video signal processing circuit 2 performs a process required for displaying an image based on the digital video signals (R, G, B) supplied from A/D converter 1 on the display device. An output signal from video signal processing circuit 2 is supplied to a drive circuit, not shown, for driving the display device.

CPU 6 controls the image display apparatus in its entirety, and, in addition, divides at least a portion of a displayed image (one-frame image) based on the digital video signals converted by A/D converter 1 into a plurality of image areas, and establishes delays for the respective divided image areas. The divided image areas comprise a plurality of horizontal display lines. The display periods of the horizontal display lines are determined by a horizontal synchronizing signal Hsync supplied from the video signal source. The delays established for the respective divided image areas serve to delay the phase of the reproduced dot clock with respect to the phase of the input analog video signals (R, G, B). The number of the divided image areas of the displayed image is determined by the relationship between a vertical synchronizing signal Vsync supplied from the video signal source and a clock V_CLK which is synchronous with the vertical synchronizing signal Vsync. The clock V_CLK comprises a plurality of pulses output in an image display period that is determined by the vertical synchronizing signal Vsync. By controlling the number and interval of these pulses, the displayed image area divided into the image areas and the number of the image areas can be adjusted. Specifically, based on an input from an input unit of the image display apparatus or a remote controller, CPU 6 changes the number and interface (frequency) of the pulses of the clock V_CLK for thereby adjusting the displayed image area divided into the image areas and the number of the image areas.

VCO 5 is of a known nature. Clock adjusting circuit 4 controls VCO 5 to generate a clock in synchronism with the horizontal synchronizing signal Hsync supplied from the video signal source. Clock adjusting circuit 4 also delays the phase of the clock generated by VCO according to the delays established for the respective divided image areas by CPU 6, and outputs the delayed clock as a reproduced dot clock. By thus delaying the dot clock according to the delays established for the respective divided image areas, it is possible to shift the phase of the reproduced dot clock stepwise generally for one period with respect to the phase of the input analog video signals R, G, B. The reproduced dot clock output from clock adjusting circuit 4 is supplied to A/D converter 1 and delay evaluating circuit 3. When clock adjusting circuit 4 is supplied with an optimum delay from delay evaluating circuit 3 through CPU 6, clock adjusting circuit 4 delays the phase of the clock generated by VCO 5 according to the optimum delay from.

Delay evaluating circuit 3 accumulatively adds differential data between adjacent signal levels (differential data between adjacent dots) on horizontal scanning lines in the divided image areas set by CPU 6 with respect to the digital video signal supplied from A/D converter 1, and judges the delay set for the image area where the accumulated sum of differential data is largest, as an optimum delay. The judged optimum delay is supplied via CPU 6 to clock adjusting circuit 4.

With the image display apparatus according to the present invention, if an image starts being displayed based on an analog video signal supplied from the video signal source or if a certain key on the image display apparatus or the remote controller is pressed after an image starts being displayed, the mode of operation of the image display apparatus changes to an automatic adjusting mode for automatically adjusting the clock. In the automatic adjusting mode, the frequency of the reproduced dot clock (or the frequency-division ratio) is adjusted. After the adjustment of the frequency is over, the phase of the reproduced dot clock is adjusted. The existing process, e.g., the process disclosed in Patent Document 2, may be applied to adjust the frequency of the reproduced dot clock. Since the adjustment of the frequency has no direct bearing on the present invention, it will not be described in detail below.

A process of adjusting the phase of the reproduced dot clock with delay evaluating circuit 3, clock adjusting circuit 4, and CPU 6 will be described in specific detail below.

Figure 4:
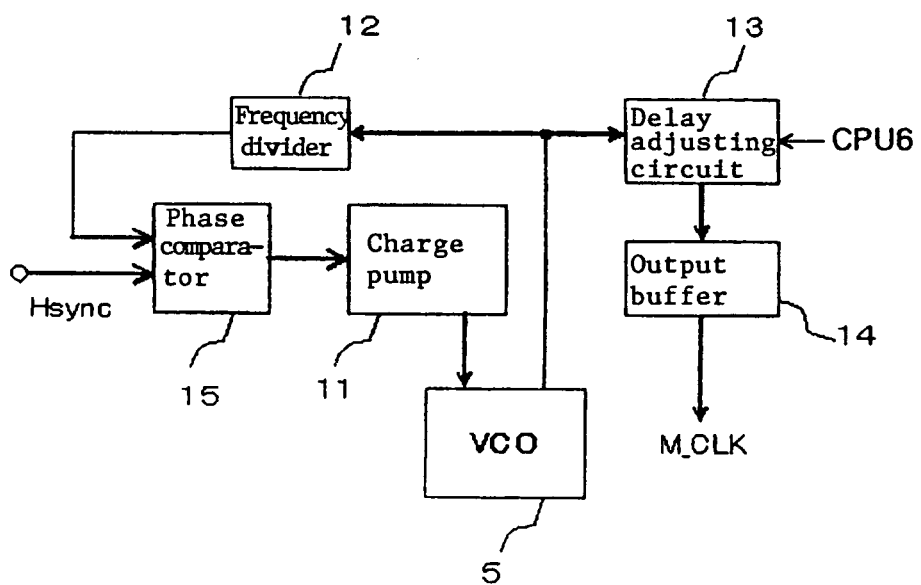
FIG. 4 is a block diagram of a clock adjusting circuit of the image display apparatus shown in FIG. 3.

FIG. 4 shows an arrangement of clock adjusting circuit 4. As shown in FIG. 4, clock adjusting circuit 4 comprises phase comparator 15 in the form of a PPL, charge pump 11, frequency divider 12, delay adjusting circuit 13, and output buffer 14.

Phase comparator 15 is supplied with the horizontal synchronizing signal Hsync from the video signal source and an output signal from frequency divider 12, and compares the phases of the supplied signals with each other. The comparison result from phase comparator 15 is supplied through charge pump 11 to VCO 5.

Delay adjusting circuit 13 adjusts the delay of the reproduced dot clock output from VCO 5 with respect to the phase of the input analog video signals (R, G, B).

Figure 5:
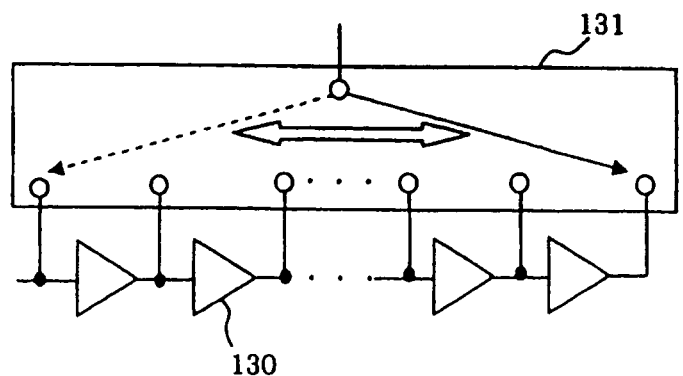
FIG. 5 is a block diagram of a delay adjusting circuit of the clock adjusting circuit shown in FIG. 4.

FIG. 5 shows an example of delay adjusting circuit 13. As shown in FIG. 5, delay adjusting circuit 13 comprises a plurality of series-connected unit delay elements 130 and selector 131 for selecting, from these unit delay elements 130, a number of unit delay elements 130 depending on the delay set by CPU 6, based on a selection signal from CPU 6. CPU 6 supplies selector 131 with a selection signal for equalizing the delay in delay adjusting circuit 13 to the delay set for each of the divided image areas.

Figure 6:
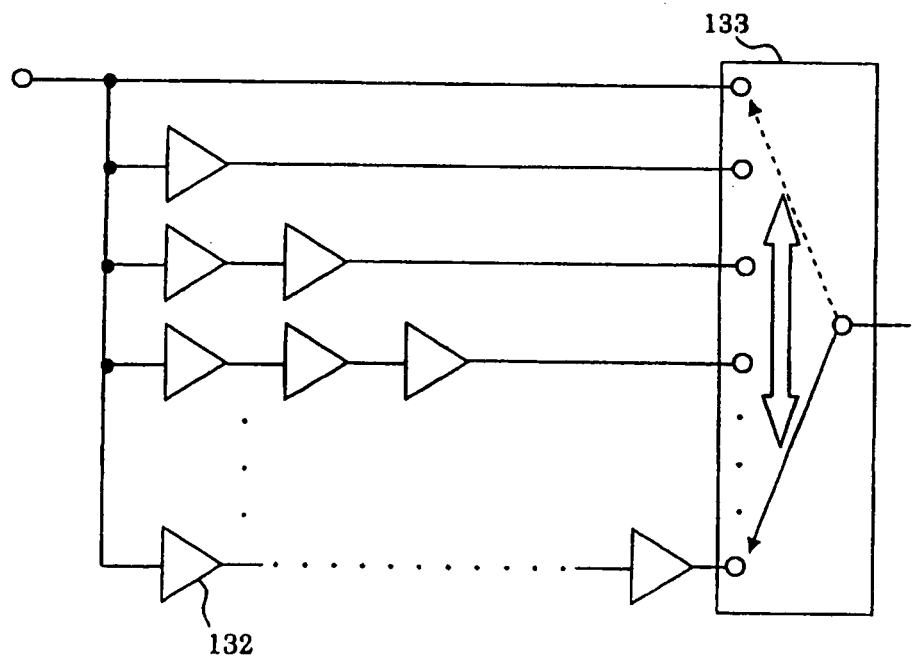
FIG. 6 is a block diagram of another delay adjusting circuit which may be used in the clock adjusting circuit shown in FIG. 4.

FIG. 6 shows another example of delay adjusting circuit 13. As shown in FIG. 6, delay adjusting circuit 13 comprises selector 133 having input terminals connected respectively to a plurality of input lines in which unit delay elements 132 are inserted. The delay determined by the number of unit delay elements 132 inserted in each input line is incremented by a unit delay from an input line to a next input line. CPU 6 supplies selector 133 with a selection signal for selecting an input line which is capable of giving a delay corresponding to the delay set for each of the divided image areas. Selector 133 selects an input line according to the selection signal from CPU 6.

Each of delay adjusting circuits 13 shown in FIGS. 5 and 6 is arranged to determine the number of unit delay elements to be connected based on the selection signal supplied from CPU 6. For example, if the image display apparatus has a highest receivable frequency of 100 MHz, the reproduced dot clock has a period of 10 nsec., and one period is divided into 10 areas, then CPU 6 determines the number of unit delay elements to be connected such that the delay of the reproduced dot clock is 1 nsec.

The delay of each unit delay element generally depends on the silicon process, the power supply voltage, and the operating temperature. At present, when a signal having a frequency of about 100 MHz is to be received, it is possible to realized a sufficiently small delay for achieving the purpose of bringing the reproduced dot clock into phase with the input video signals.

The clock that has been delayed by delay adjusting circuit 13 is temporarily stored in buffer 14, and then supplied as the reproduced dot clock to A/D converter 1 and delay evaluating circuit 3.

Figure 7:
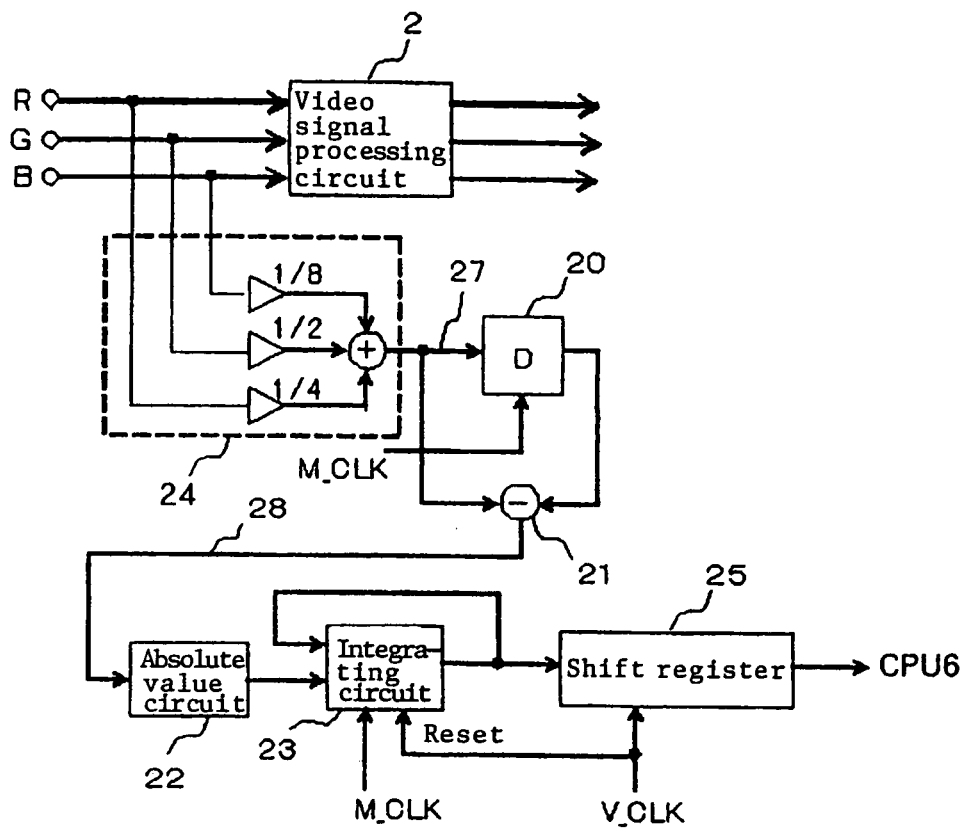
FIG. 7 is a block diagram of a delay evaluating circuit of the image display apparatus shown in FIG. 3.

FIG. 7 shows a specific arrangement of delay evaluating circuit 3. As shown in FIG. 7, delay evaluating circuit 3 comprises latch circuit 20, subtractor 21, absolute value circuit 22, integrating circuit 23, delay evaluating signal generator 24, and shift register 25.

Delay evaluating signal generator 24 generates delay evaluating signal 27 by adding the digital video signals (R, G, B) supplied from A/D converter 1 at predetermined proportions. In this event, the digital video signals are added at the proportions of "R:G:B=0.25 (¼):0.5 (½):0.125 (⅛)." The proportions are established such that they are greater as the human visibility for the colors R, G, B is higher. According to these proportions, since the delay is primarily evaluated using the digital video signal (G) for which the human visibility is higher, the phase of the reproduced dot clock is adjusted with respect to the digital video signal (G) for which the human visibility is higher. The human visibility for the digital video signal (G) is higher than that for the digital video signals (R, B), so that any image quality degradation due to a phase shift appears more evidently for the digital video signal (G) than for the digital video signals (R, B). Therefore, the higher ratio of the digital video signal (G) is more effective to reduce an image quality degradation due to a phase shift.

The video signals at the proportions depending on the human visibility are added according to the reciprocal of a power of 2. Therefore, the addition can be performed by a bit shift only and can easily be realized. In this case, the delay evaluating signal is compressed to ⅞ of the original video signals. If a wider dynamic range is needed, then it is possible to set the delay evaluating signal to such a proportion that it will be amplified with respect to the original video signals. Since the delay evaluating signal is used only for evaluating the delay, it will not obstruct the display of the video signals even if it is saturated when amplified.

Delay evaluating signal 27 generated by delay evaluating signal generator 24 is supplied to respective one input terminals of latch circuit 20 and subtractor 21. Latch circuit 20 operates according to a reproduced dot clock M_CLK supplied from clock adjusting circuit 4 to latch delay evaluating signal 27 at a timing determined by reproduced dot clock M_CLK. Latch circuit 20 applies its output signal to the other input terminal of subtractor 21.

Subtractor 21 determines the difference between delay evaluating signal 27 supplied from delay evaluating signal generator 24 and the output signal from latch circuit 20. Subtractor 21 supplies its output signal to an input terminal of integrating circuit 23 through absolute value circuit 22. Absolute value circuit 22 calculates the absolute value of the output signal supplied from subtractor 21.

Integrating circuit 23 has its output signal branched and applied to its other input terminal through a feedback loop. Integrating circuit 23 is also supplied with the clock V_CLK from CPU 6 as a reset signal. Integrating circuit 23 accumulatively adds the output signal from absolute value circuit 22 and the feedback input signal until it is supplied with the reset signal. When integrating circuit 23 is supplied with the reset signal, integrating circuit 23 outputs the accumulated sum to shift register 25, and clears the accumulated sum held therein.

Operation principles of delay evaluating circuit 3 will be described below.

Delay evaluating signal 27 output from delay evaluating signal generator 24 is supplied directly to an input terminal of subtractor 21 and supplied through latch circuit 20 to the other input terminal of subtractor 21. Latch circuit 20 delays input delay evaluating signal 27 by one clock pulse of the reproduced dot clock M_CLK supplied from clock adjusting circuit 4. Therefore, the delay evaluating signal supplied to the other input terminal of subtractor 21 is delayed with respect to the delay evaluating signal supplied to the first-mentioned input terminal of subtractor 21 by one clock pulse of the reproduced dot clock M_CLK by latch circuit 20. Subtractor 21 outputs differential data 28 representative of the difference between the delay evaluating signal directly supplied from delay evaluating signal generator 24 and the delay evaluating signal that has been delayed by one clock pulse of the reproduced dot clock M_CLK by latch circuit 20.

If the phase of reproduced dot clock M_CLK is adjusted correctly (the state shown in FIG. 1), then as the change in delay evaluating signal 27 per clock pulse is greater, the absolute value of differential data 28 is greater, and, conversely, as the change in delay evaluating signal 27 per clock pulse is smaller, the absolute value of differential data 28 is smaller. This is because if the phase is correct, the video signals can be sampled correctly without being affected by jitter.

Delay evaluating signal 27 represents a mixture of input video signals (R, G, B) at respective proportions, and is closely correlated to the video signals. For example, if a video signal representing alternate white and black dots is supplied from the video signal source, then the absolute value of the differential data is maximum.

Figure 8:
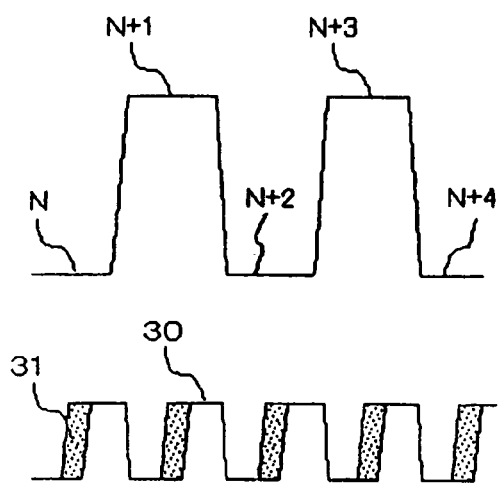
FIG. 8 is a diagram showing the phase relationship between a delay evaluating signal that is acquired from an input video signal representing alternate white and black dots, and a reproduced dot clock.

FIG. 8 shows the phase relationship between a delay evaluating signal that is acquired from an input video signal representing alternate white and black dots, and a reproduced dot clock. In the example shown in FIG. 8, the phase of reproduced dot clock 30 is adjusted correctly, and jitter areas 31 are present in flat areas of delay evaluating signals N, N+1, N+2, N+3, N+4. If "white" is given as "R=G=G=255" and "black" as "R=G=B=0", then the Nth delay evaluating signal is represented by "0" and the (N+1)th delay evaluating signal by "255/2+255/4+255/8=221" with the fractional part being rounded off by the bit shift operation. Similarly, each of the (N+2)th delay evaluating signal and the (N+4)th delay evaluating signal is represented by "0", and the (N+3)th delay evaluating signal by "221". If the difference between adjacent delay evaluating signals is determined and converted into the absolute value, then it is represented by "221" at all times. In other words, when a video signal whose level change between adjacent signal values (dots) is large, such as a video signal representing alternate white and black dots (a maximum level change occurs from a white dot to a white dot or from a black dot to a white dot), is received, if the phase of the reproduced dot clock is adjusted correctly, then the delay evaluating value is maximum.

Figure 2:
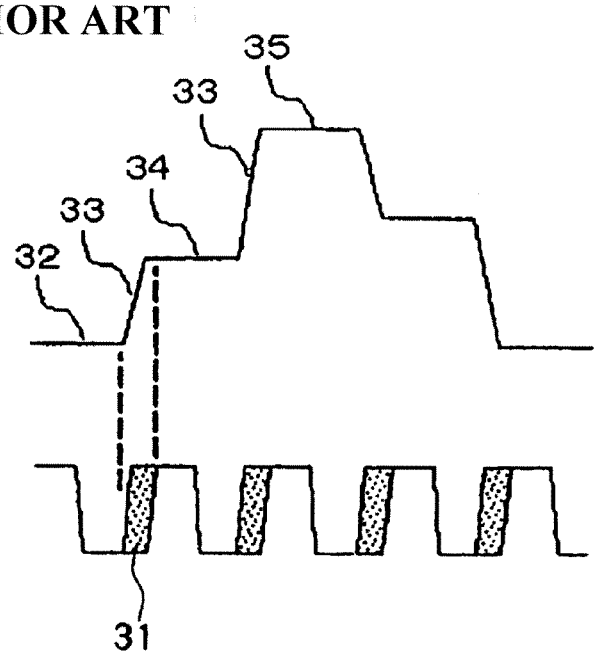
FIG. 2 is a diagram showing the manner in which an input video signal and a reproduced dot clock are out of phase with each other.

If the phase of the reproduced dot clock M_CLK is not adjusted correctly (the state shown in FIG. 2), then when A/D converter 1 samples the analog video signals (R, G, B) at the positive-going edges of the reproduced dot clock, the output signal from A/D converter 1 changes depending on the positions of the positive-going edges.

For example, if the first positive-going edge of the reproduced dot clock is positioned at the foremost end of jitter area 31, then video signal 32 is sampled. If the first positive-going edge of the reproduced dot clock is positioned at the rearmost end of jitter area 31, then video signal 34 is sampled. If the first positive-going edge of the reproduced dot clock is positioned at an intermediate region of jitter area 31, then changing point 33 is sampled, and the output signal from A/D converter 1 represents an intermediate value between video signals 32, 33.

Figure 9:
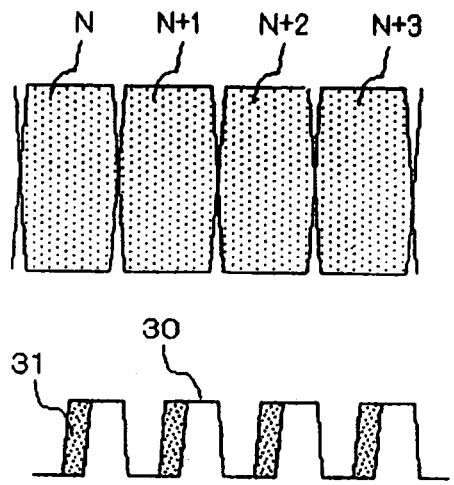
FIG. 9 is a diagram illustrative of a delay evaluating signal that is produced when an input video signal representing alternate white and black dots is supplied.

The positive-going edge of the reproduced dot clock is present somewhere in jitter area 31, but cannot be specified in position. Therefore, when a video signal representing alternate white and black dots is supplied, the delay evaluating signal may take a value in a range from 0 to 221, and is indefinite, as shown in FIG. 9. If it is assumed that the positive-going edge of the reproduced dot clock randomly present in the jitter area, then the delay evaluating signal may have a random value in the range from 0 to 221. In this case, it is considered that an accumulated sum produced by accumulatively adding the absolute values of the differences between adjacent delay evaluating signals is about one-half of the accumulated sum that is produced when the phase of the reproduced dot clock is adjusted correctly as shown in FIG. 8. Actually, since the positive-going edge of the reproduced dot clock is considered to be present according to a certain probability distribution around the intermediate point in the jitter area, the delay evaluating value determined by accumulatively adding the absolute values of the differences between adjacent delay evaluating signals is considered to be one-half or less of accumulated sum that is produced when the phase of the reproduced dot clock is adjusted correctly.

In reality, it is rare for a video signal representing alternate white and black dots to be supplied. The phase state of the reproduced dot clock, i.e., the delay added by the delay adjusting circuit, can be evaluated based on the accumulated sum of the absolute values of differential data. In other words, as the video signal contains a higher frequency, the output signal from the delay evaluating circuit becomes greater, and as the positive-going edge of the reproduced dot clock is positioned more in the stable period of the video signal, the output signal from the delay evaluating circuit becomes greater. When an ordinary video signal is received, the phase of the reproduced dot clock can be adjusted optimally by selecting a delay where the accumulated sum output from the delay evaluating circuit is maximum.

If a video signal for displaying a uniform image over the entire display screen is received, then the accumulated sum is minimum at all times regardless of th phase state. Therefore, when a video signal for displaying a uniform image over the entire display screen is supplied, the phase of the reproduced dot clock may not be adjusted correctly. In this case, when a video signal for displaying an image suitable for phase adjustment is received, the automatic adjusting mode for automatically adjusting the clock is selected to adjust the phase.

The evaluation of a delay for each divided image area will be described in specific detail below.

Figure 10:
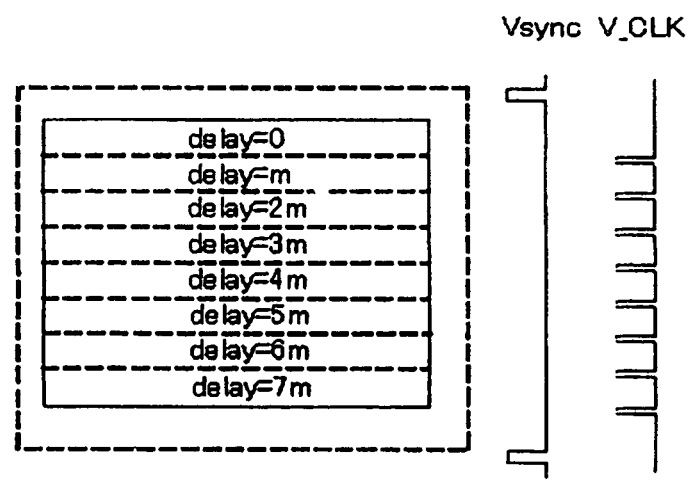
FIG. 10 is a diagram showing the manner in which delays are established for respective divided image areas.

FIG. 10 shows the relationship between the divided image areas (division lines) of a displayed image, delays for the respective divided image areas, vertical synchronizing signal Vsync pulses, and the clock V_CLK. In FIG. 10, the broken-line frame indicates a displayed range of an image based on one frame of video data including the blanking period of a video signal. A delay m is set to a fraction of one period of the reproduced dot clock. The number of divided image areas is the same as the number of divisions of one period of the reproduced dot clock. Both the number of divided image areas and number of divisions of one period are set to ⅛. A negative-going edge of the vertical synchronizing signal Vsync represents a start point of the frame.

The evaluation of a delay is performed based on the accumulated sum of the absolute values of differential data that is obtained for each of the divided image areas to which delays "delay=0" through "delay=7m" are set.

First, the accumulated sum of the absolute values of differential data is determined with respect to the first image area (the divided image area with the delay "delay=0"). In this process, CPU 6 sets the delay of delay adjusting circuit 13 to "delay=0". Delay adjusting circuit 13 gives the delay "delay=0" to the reproduced dot clock output from VCO 5. The reproduced dot clock M_CLK to which the delay "delay=0" is given is supplied to A/D converter 1 and delay evaluating circuit 3.

A/D converter 1 samples analog video signals (R, G, B) supplied from the video signal source based on the reproduced dot clock M_CLK to which the delay "delay=0" is given, supplied from clock adjusting circuit 4, and converts the sampled analog video signals (R, G, B) into digital video signals (R, G, B). The digital video signals (R, G, B) are supplied to video signal processing circuit 2 and delay evaluating circuit 3.

In delay evaluating circuit 3, delay evaluating signal generator 24 adds the digital video signals (R, G, B) supplied from A/D converter 1 at predetermined proportions, thereby generating delay evaluating signal 27. Generated delay evaluating signal 27 is supplied directly to the input terminal of subtractor 21, and is also supplied to latch circuit 20 which delays delay evaluating signal by one clock pulse of the reproduced dot clock M_CLK to which the delay "delay=0" is given. Delayed delay evaluating signal 27 is supplied from latch circuit 20 to the other input terminal of subtractor 21.

Subtractor 21 calculates the difference between the first delay evaluating signal supplied to one of the input terminals and the second delay evaluating signal supplied to the other input terminal. The first delay evaluating signal and the second delay evaluating signal correspond respectively to data signals of adjacent dots on the horizontal display line, e.g., signals 32, 34 of the video signal shown in FIG. 1.

The differential data between the first delay evaluating signal and the second delay evaluating signal, which is output from subtractor 21, is supplied to integrating circuit 23 through absolute value circuit 22. Each time differential data (absolute value) is input to integrating circuit 23, integrating circuit 23 adds the input differential data to the differential data that have been input thereto so far.

Delay evaluating circuit 3 accumulatively adds the differential data between the first delay evaluating signal and the second delay evaluating signal until a first pulse of the clock V_CLK shown in FIG. 10 is supplied to delay evaluating circuit 3. When a first pulse of the clock V_CLK is supplied, the accumulated sum generated by integrating circuit 23 is supplied to shift register 25, and the accumulated sum held by integrating circuit 23 is cleared.

The accumulated sum of the differential data (absolute value) of adjacent dots on each of the horizontal display lines in the first image area is thus stored in shift register 25.

When integrating circuit 23 is cleared to zero, CPU 6 sets the delay of delay adjusting circuit 13 to "delay=m". The phase of the reproduced dot clock is now shifted by a ⅛ period. As a result, delay evaluating circuit 3 accumulatively adds the absolute values of the differential data with respect to the second image area (the divided image area with the delay "delay=m"). Subsequently, CPU 6 sets the delay of delay adjusting circuit 13 and delay evaluating circuit 3 accumulatively adds the absolute values of the differential data, repeatedly until the delay becomes "delay=7m".

Figure 11:
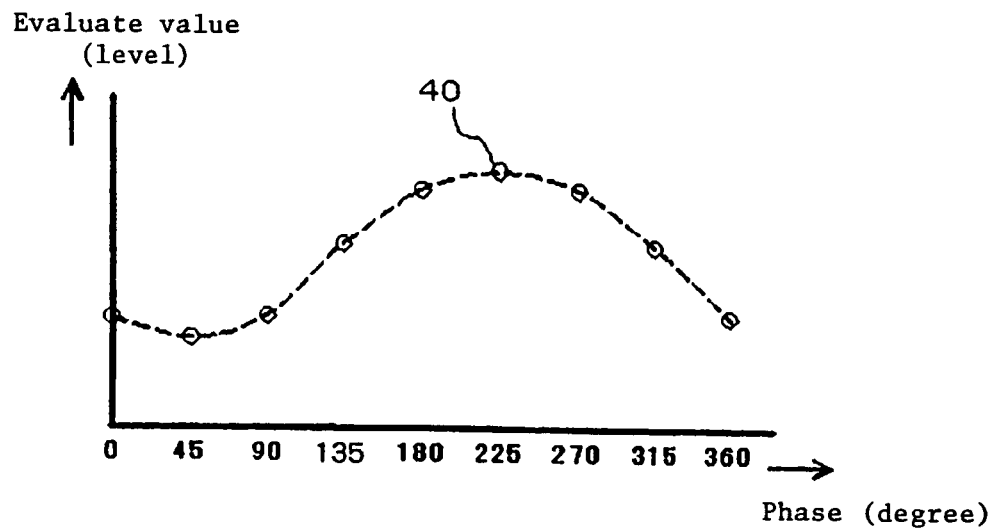
FIG. 11 is a diagram showing the correlation between evaluated values of the delays for the divided image areas shown in FIG. 10 and the phase of the reproduced dot clock.

FIG. 11 shows the correlation between evaluated values (accumulated sums) of the delays for the divided image areas shown in FIG. 10 and the phase of the reproduced dot clock. The vertical axis represents the evaluated values, and the horizontal axis the delays of the reproduced dot clock. The phase of the reproduced clock is shifted stepwise in ⅛ periods) (45°) with respect to the input video signals.

When the evaluation of one frame is over, CPU 6 reads the evaluated values (accumulated sums) for the divided image areas stored in shift register 25, and determines a maximum value thereof (point 40 in FIG. 11). CPU 6 then judges that the delay giving the maximum value represents an optimum value for adjusting the phase of the reproduced dot clock. The optimum value is supplied from CPU 6 to clock adjusting circuit 4. Subsequently, clock adjusting circuit 4 performs a process of delaying the clock from VCO 5 based on the supplied optimum value (delay), and the automatic adjusting process is put to an end.

As described above, since the image display apparatus according to the present embodiment can determined an optimum delay simply by evaluating one frame of image, the phase of the reproduced dot clock can be adjusted extremely quickly.

Figure 1:
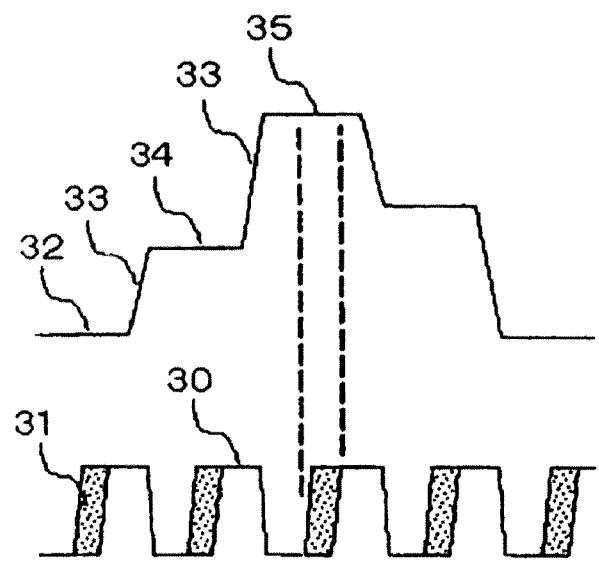
FIG. 1 is a diagram showing the manner in which the phase relationship between an input video signal and a reproduced dot clock is correctly adjusted.

As shown in FIG. 1, the optimum value for the phase of the reproduced dot clock has a certain margin. Therefore, even if a true maximum value is present between sampled points in the graph shown in FIG. 11, the process of automatically adjusting the phase of the reproduced dot clock is not obstructed.

In the example shown in FIG. 11, the evaluated value (point 40) at the phase of 225 degrees is maximum. Actually, it is considered that the displayed image will not suffer flickering at the phase of 180 degrees and the phase of 270 degrees. Therefore, the number of divisions of the reproduced dot clock and the number of divided image areas can be determined depending on an image signal having a maximum frequency that the image display apparatus can handle.

Other Embodiments

If a very long cable which is not up to given standards is used to interconnect the video signal source and the image display apparatus or if the layout of components in the image display apparatus, i.e., the pattern of signal lines for transmitting a video signal and a dot clock, is not appropriate in the case where a digital video signal is supplied from the video signal source, then the dot clock and the digital video signal may possibly be out of phase with each other. In the case where a digital video signal is supplied from the video signal source, the image display apparatus according to the above embodiment may also be applied to bring the dot clock into phase with the digital video signal. An image display apparatus which is capable of switching between an analog video signal and a digital video signal and of adjusting the phase of the dot clock with respect to an input video signal will be described below.

Figure 12:
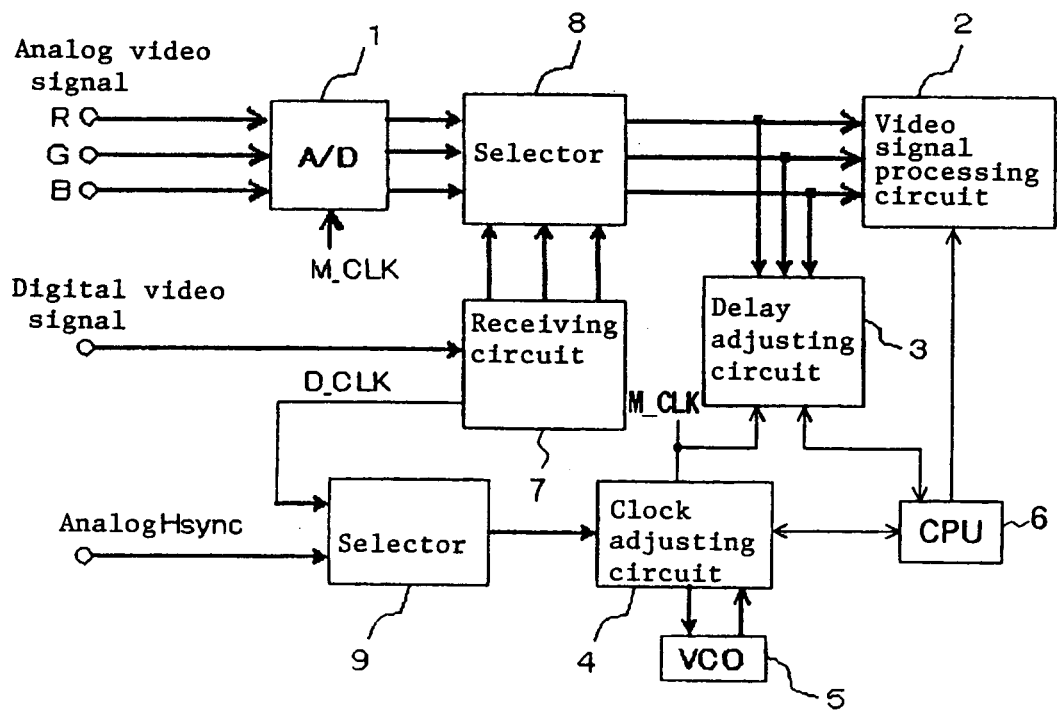
FIG. 12 is a block diagram showing a general arrangement of an image display apparatus according to another embodiment of the present invention.

FIG. 12 shows in block form a general arrangement of an image display apparatus according to another embodiment of the present invention. The image display apparatus shown FIG. 12 is capable of adjusting the phase of the reproduced dot clock with respect to both an analog video signal and a digital video signal. As shown in FIG. 12, the image display apparatus has, in addition of the arrangement shown in FIG. 3, receiving circuit 7 and selectors 8, 9. A video signal source for supplying analog video signals to A/D converter 1 will be referred to as an analog video signal source, and a video signal source for supplying digital video signals to receiving circuit 7 will be referred to as a digital video signal source.

Receiving circuit 7 receives digital video signals (R, G, B), horizontal and vertical synchronizing signals, and a dot clock from the digital video signal source. Receiving circuit 7 supplies the received digital video signals (R, G, B) to selector 8, and supplies the received dot clock as a digital clock D_CLK to selector 9.

Selector 8 is supplied with the digital video signals (R, G, B) from A/D converter 1 and the digital video signals (R, G, B) from receiving circuit 7, and selectively outputs these supplied digital video signals (R, G, B) based on a control signal from CPU 6.

Selector 9 is supplied with a horizontal synchronizing signal from the analog video signal source and the digital clock D_CLK from receiving circuit 7, and selectively outputs the supplied signals based on a control signal from CPU 6. The output signal from selector 9 is supplied to clock adjusting circuit 4.

When analog video signals are received from the analog video signal source, selector 8 selects the digital video signals output from A/D converter 1, and selector 9 selects the horizontal synchronizing signal from the analog video signal source. In this case, an optimum delay is determined in the same manner as with the above embodiment.

When digital video signals are received from the digital video signal source, selector 8 selects the digital video signals output from receiving circuit 7, and selector 9 selects the digital clock D_CLK from receiving circuit 7. Clock adjusting circuit 4 and the delay evaluating circuit determine an optimum delay.

A process of determining an optimum delay will be described in specific detail below.

Clock adjusting circuit 4 is of the same structure as clock adjusting circuit 4 shown in FIG. 4. The digital clock D_CLK output from selector 9 is supplied to phase comparator 15, and VCO 5 generates a clock in synchronism with the digital clock D_CLK. The clock generated by VCO 5 is delayed by delay adjusting circuit 13, and then output through buffer 14. The clock output from buffer 14 is supplied as a reproduced dot clock M_CLK to delay evaluating circuit 3.

Delay evaluating circuit 3 is of the same structure as delay evaluating circuit 3 shown in FIG. 7. Delay evaluating signal generator 24 generates delay evaluating signal 27 by adding the digital video signals (R, G, B) supplied from selector 8 at predetermined proportions. Delay evaluating signal 27 is supplied directly to an input terminal of subtractor 21 and supplied through latch circuit 20 to the other input terminal of subtractor 21. Subtractor 21 outputs differential data 28 representative of the difference between the delay evaluating signal directly supplied from delay evaluating signal generator 24 and the delay evaluating signal that has been delayed by one clock pulse of the reproduced dot clock M_CLK by latch circuit 20. Subtractor 21 supplies its output signal to an input terminal of integrating circuit 23 through absolute value circuit 22. Integrating circuit 23 accumulatively adds the output signal from absolute value circuit 22 and the feedback input signal until it is supplied with the reset signal (clock V_CLK). When integrating circuit 23 is supplied with the reset signal, integrating circuit 23 outputs the accumulated sum to shift register 25, and clears the accumulated sum held therein.

Delay evaluating circuit evaluated a delay with respect to the accumulated sum for each of the divided image areas shown in FIG. 10. The accumulated sum of differential data of adjacent dots in each of the divided image area is stored in shift register 25. When the evaluation of one frame is over, CPU 6 reads the evaluated values (accumulated sums) for the divided image areas stored in shift register 25, and determines a maximum value thereof. CPU 6 then judges that the delay giving the maximum value represents an optimum value for adjusting the phase of the reproduced dot clock. The optimum value is supplied from CPU 6 to clock adjusting circuit 4. Subsequently, clock adjusting circuit 4 performs a process of delaying the clock from VCO 5 based on the supplied optimum value (delay), and the automatic adjusting process is put to an end.

The image display apparatus according to the present embodiment is thus capable of adjusting the phase of the reproduced dot clock both when it displays an image based on the analog video signals supplied from the analog video signal source and when it displays an image based on the digital video signals supplied from the digital video signal source.

The clock phase adjusting circuit and the delay evaluating circuit are used in common for adjusting the phase of the analog video signals and the phase of the digital video signals. Therefore, the image display apparatus has its circuit scale prevented from being unduly increased.

When the digital video signals are received, the phase of the reproduced dot clock is considered to have been adjusted correctly. For example, even if a cable which is not up to given standards is used and the reproduced dot clock and the digital video signals are out of phase with each other, such a phase shift is considered to be up to about a ¼ period. When the digital video signals are received, therefore, the evaluation may be performed while changing the phase in the ¼ period, and it is not necessary to perform the evaluation while changing the phase fully in one period as is the case with the analog video signals. In this case, the phase of the reproduced dot clock should preferably be adjusted at a higher resolution.

The image display apparatus according to the above embodiments are given by way of example only, and their structural and operational details may be varied without the scope of the present invention.

For example, if an image starts being displayed based on an analog video signal (or a digital video signal) supplied from the video signal source or if a certain key on the image display apparatus or the remote controller is pressed after an image starts being displayed, the mode of operation of the image display apparatus changes to an automatic adjusting mode for automatically adjusting the clock. In the automatic adjusting mode, the frequency of the reproduced dot clock is adjusted using one frame of image. However, the phase of the reproduced dot clock may be adjusted using one frame of image, per frame. The phase adjustment performed per frame is effective to avoid a phase shift due to a temperature drift (a phase variation of the internal clock (VCO clock) due to a temperature change in the image display apparatus).

In the above embodiments, an overall one frame of image is divided into a plurality of image areas, and the delay is changed in each of the divided image areas for phase evaluation. The present invention is not limited to such an arrangement. At least a portion of one frame (or one field) of image may be divided into a plurality of image areas, and the delay may changed in each of the divided image areas for phase evaluation.

In the above embodiments, the reproduced dot clock is of a single layer. However, if the reproduced dot clock is provided in two or more layers, i.e., if a dot clock having a frequency higher than the operating frequency of the A/D converter is received, then the present invention is applied to the reproduced dot clock in each of the layers. Specifically, if two clocks that are 180° out of phase with each other are used in two layers, then the phase of each of the clocks is adjusted. In this case, the clock adjusting circuit and the delay evaluating circuit are employed for each of the clocks.

While preferred embodiments of the present invention have been described using specific terms, such description is for illustrates purposes only, and it is to be understood that changes and variations may be made without departing from the spirit or scope of the following claims.

What is claimed is:

1. A method of adjusting a phase of a dot clock phase in an image display apparatus for being supplied with a digital video signal whose signal level changes at a constant dot clock that is higher than a frequency of a synchronizing signal representing a display period in a given direction of a displayed image, and displaying an image based on the digital video signal, said method comprising:
    dividing at least a portion of the displayed image based on the digital video signal, into a plurality of image areas, in a horizontal direction, defined by display lines in said given direction, and establishing different delays for the divided image areas;
    generating a clock in synchronism with said dot clock, delaying a phase of the clock according to the delays established for respective divided image areas, and outputting the delayed clock as a reproduced dot clock;
    converting differential data between adjacent signal levels into absolute values and accumulatively adding the absolute values in said given direction based on said reproduced dot clock, with respect to the display lines which define said divided image areas, thereby producing accumulated sums; and
    judging the delay established for the divided image areas with a maximum accumulated sum, as an optimum delay,
    wherein a same value of the optimum delay is applied to entire image areas of the displayed image,
    wherein said accumulatively adding uses an addition unit that adds video signals of said digital video signal at respective predetermined proportions to generate a delay evaluating signal,
    wherein said video signals comprises a first digital video signal, a second digital video signal, and a third digital video signal, and
    wherein said accumulatively adding adds said first digital video signal, said second digital video signal, and said third digital video signal with the predetermined proportions that include ¼, ½, ⅛, respectively.

2. The method according to claim 1, wherein said accumulatively adding adds said differential data for said divided image areas with respect to said delay evaluating signal generated by said addition unit.

3. The method according to claim 1, wherein said video signals include, in respective colors, different wavelengths for respective images to be displayed.

4. The method according to claim 1, wherein said accumulatively adding adds said differential data for said divided image areas with respect to said delay evaluating signal generated by said addition unit, and
    wherein said first digital video signal, said second digital video signal, and said third digital video signal display a red color image, a blue color image, and a green color image, respectively.

5. The method according to claim 1, wherein a same value of the maximum accumulated sum is set to each of the divided image areas as the value of the optimum delay for said adjusting the phase of the dot clock phase.

6. The method according to claim 1, wherein the value of the optimum delay for said adjusting the phase of the dot clock phase is determined in one frame of the displayed image.

7. An image display apparatus for being supplied with a digital video signal whose signal level changes at a constant dot clock that is higher than a frequency of a synchronizing signal representing a display period in a given direction of a displayed image, and displaying an image based on the digital video signal, said image display apparatus comprising:
    control means for dividing at least a portion of the displayed image based on the digital video signal, into a plurality of image areas, in a horizontal direction, defined by display lines in said given direction, and establishing different delays for the divided image areas;
    clock adjusting means for generating a clock in synchronism with said dot clock, delaying a phase of the clock according to the delays established by said control means, for respective ones of the divided image areas, and outputting the delayed clock as a reproduced dot clock; and
    delay evaluating means for converting differential data between adjacent signal levels into absolute values and accumulatively adding the absolute values in said given direction based on said reproduced dot clock output from said clock adjusting means, with respect to the display lines which define said divided image areas, thereby producing accumulated sums,
    wherein said control means judges the delay established for the divided image areas with a maximum accumulated sum, as an optimum delay, and
    wherein the control means applies a same value of the optimum delay to entire image areas of the displayed image,
    wherein said delay evaluating means comprises addition means for adding video signals of said digital video signal at respective predetermined proportions to generate a delay evaluating signal, and
    wherein said video signals comprises a first digital video signal, a second digital video signal, and a third digital video signal, said delay evaluating means adding said first digital video signal, said second digital video signal, and said third digital video signal with the predetermined proportions that include ¼, ½, ⅛, respectively.

8. The image display apparatus according to claim 7, wherein said delay evaluating means accumulatively adds said differential data for said divided image areas with respect to said delay evaluating signal generated by said addition means.

9. The image display apparatus according to claim 7, wherein said video signals include, in respective colors, different wavelengths for respective images to be displayed.

10. The image display apparatus according to claim 7, wherein said delay evaluating means accumulatively adds said differential data for said divided image areas with respect to said delay evaluating signal generated by said addition means, and
wherein said first digital video signal, said second digital video signal, and said third digital video signal display a red color image, a blue color image, and a green color image, respectively.

11. The image display apparatus according to claim 7, wherein a same value of the maximum accumulated sum is set to each of the divided image areas as a value of the optimum delay for a phase adjustment of said reproduced dot clock.

12. The image display apparatus according to claim 7, wherein a value of the optimum delay for a phase adjustment of said reproduced dot clock is determined in one frame of the displayed image.

* * * * *